United States Patent [19]
Lundt et al.

[11] Patent Number: 5,741,173
[45] Date of Patent: Apr. 21, 1998

[54] METHOD AND APPARATUS FOR MACHINING SEMICONDUCTOR MATERIAL

[75] Inventors: Holger Lundt, Burghausen, Germany; Karl Kobler, Mattighofen, Austria; Hanifi Malcok, Burghausen, Germany

[73] Assignee: Wacker Siltronic Gesellschaft für Halbleitermaterialien AG, Burghausen, Germany

[21] Appl. No.: 734,687

[22] Filed: Oct. 21, 1996

[30] Foreign Application Priority Data

Dec. 15, 1995 [DE] Germany ............ 195 46 988.7

[51] Int. Cl.⁶ ...................... B24B 53/007
[52] U.S. Cl. ............ 451/56; 451/444; 125/13.01
[58] Field of Search .................. 125/13.02, 13.01, 125/1, 11.22, 23.01; 451/444, 450

[56] References Cited

U.S. PATENT DOCUMENTS

| | | | |
|---|---|---|---|
| 3,123,951 | 3/1964 | Kuris et al. | 451/444 |
| 4,498,345 | 2/1985 | Dyer et al. | 73/849 |
| 4,844,047 | 7/1989 | Brehm et al. | 451/41 |

FOREIGN PATENT DOCUMENTS 0476952  3/1992  European Pat. Off. .

OTHER PUBLICATIONS

Patent Abstracts of Japan, vol. 95, No. 010 & JP 07283183 A.

Patent Abstracts of Japan, vol. 014, No. 564 (E–1013), 14, Dec. 1990.

Patent Abstracts of Japan, vol. 014, No. 099 (E–0893), 22, Feb. 1990.

*Primary Examiner*—Robert A. Rose
*Attorney, Agent, or Firm*—Collard & Roe, P.C.

[57] ABSTRACT

A method and an apparatus are for machining semiconductor material with a grinding tool while feeding a liquid cleaning agent to the working surface of the grinding tool, has the cleaning agent being exposed to sound waves having a specific frequency and having a specific intensity. In one embodiment of the method, the cleaning agent is exposed to sound waves in at least one nozzle and then the cleaning agent is directed against the working surface of the grinding tool. In another embodiment, the cleaning agent is guided through at least two cleaning agent jets against the working surface of the grinding tool, which cleaning agent jets differ from each other in that they are exposed to sound waves of different frequencies.

8 Claims, 1 Drawing Sheet

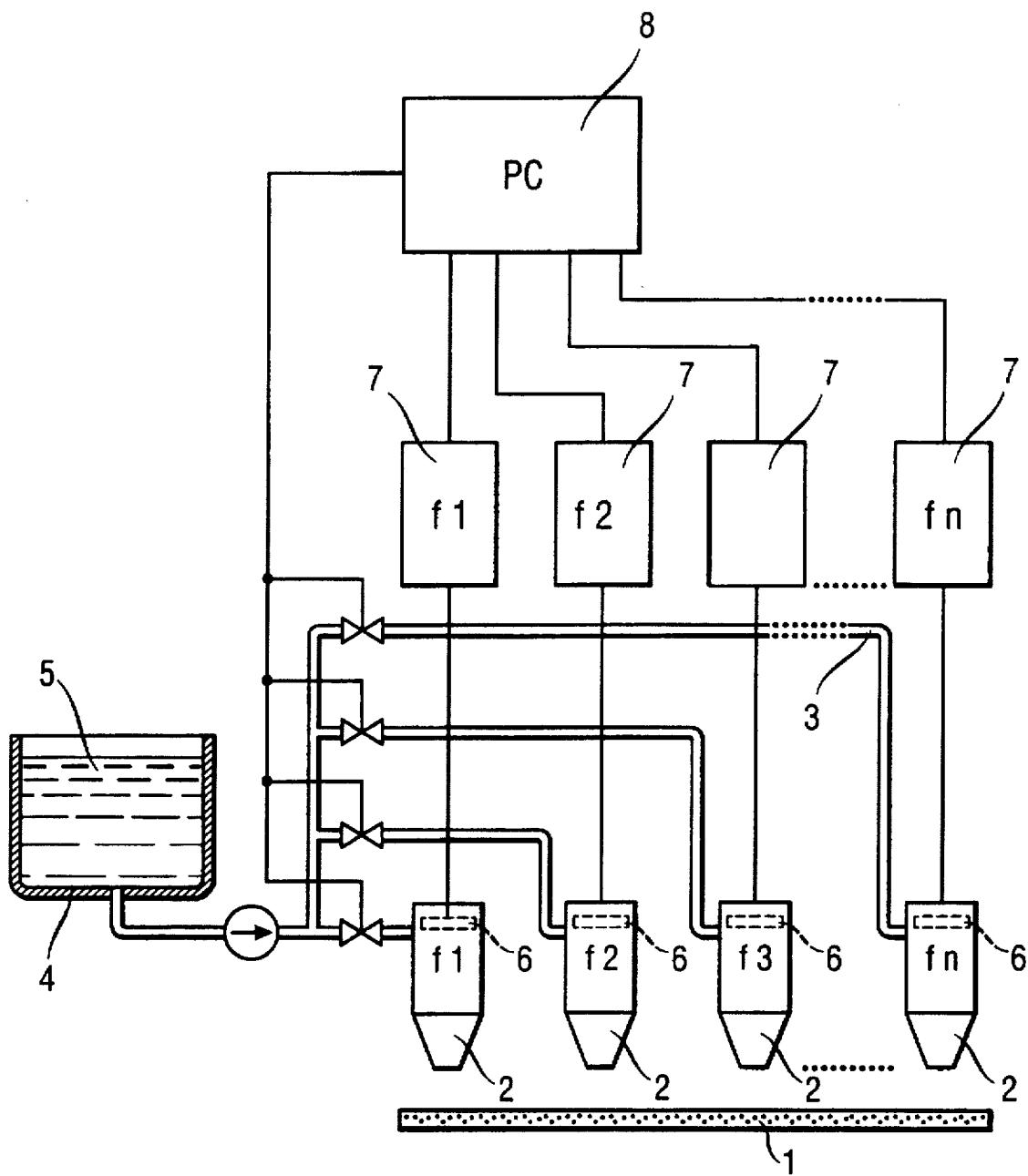

METHOD AND APPARATUS FOR MACHINING SEMICONDUCTOR MATERIAL

BACKGROUND OF THE INVENTION

1. Field of the Invention

The present invention relates to a method for machining semiconductor material with a grinding tool while feeding a liquid cleaning agent to the working surface of the grinding tool, with the cleaning agent being exposed to sound waves having a specific frequency and a specific intensity. The invention also relates to an apparatus for carrying out the method.

2. The Prior Art

The machining of semiconductor material with grinding tools often requires extreme precision. This applies particularly to the production of semiconductor wafers from an ingot-type crystal with the aid of abrasive cutting machines, so-called annular saws. In this operation, it is important that the semiconductor wafers produced have as flat and as parallel side faces as possible. Geometrical errors manifest themselves, in particular, in sagging of the wafers, which is referred to as warp in specialist jargon. Efforts are continually being made to keep the warp of the semiconductor wafers as small as possible in their production from a crystal ingot.

U.S. Pat. No. 5,313,741 discloses an abrasive cutting method in which the cutting force which the saw blade exerts on the workpiece is continuously measured in the cutting direction and in two directions orthogonal thereto. In conjunction with this operation, a cleaning liquid is sprayed against the cutting edge of the annular saw from a nozzle and the liquid jet is exposed to ultrasound from an external source. If the measured cutting force exceeds a specific limit value, the speed of advance is reduced and the speed of rotation of the saw blade is increased simultaneously. Although this method makes lower warp values probable in the semiconductor wafers produced, an economical disadvantage has also to be accepted as a result of the reduction in the speed of advance because the output of semiconductor wafers per machine and unit time is reduced.

SUMMARY OF THE INVENTION

It is an object of the present invention to overcome the disadvantages mentioned above.

The present invention achieves the above object by providing a method for machining semiconductor material with a grinding tool while feeding a liquid cleaning agent to the working surface of the grinding tool. The cleaning agent is exposed to sound waves having a specific frequency and a specific intensity. The improved method further comprises exposing the cleaning agent to sound waves in at least one nozzle and then directing the liquid cleaning agent which flows through the nozzle against the working surface of the grinding tool after the liquid cleaning agent exits the nozzle.

The present invention also relates to a method which comprises directing the liquid cleaning agent in the form of at least two cleaning agent jets from two different nozzles against the working surface of the grinding tool, which jets differ from each other in that they are exposed to sound waves of different frequencies.

If the present invention is used to produce semiconductor wafers by abrasive cutting of a crystal ingot by means of an annular saw, it can not only be established that the semiconductor wafers produced have lower warp values, but also that an increase in the speed of advance of the grinding tool and therefore an increase in the output of semiconductor wafers per machine and unit time is possible. The reason for this is attributable to the considerably improved action of the cleaning agent which prevents the cutting space behind the abrasive particles (for example, diamond particles) from being obstructed.

As a result of the increase in output to be noted, the present invention is essentially suitable for all types of grinding treatment of semiconductor material and is not restricted to the treatment of semiconductor wafers. In addition to the cutting of a crystal ingot into semiconductor wafers, preferred fields of application include the rounding of the edges of semiconductor wafers in the thickness direction and along their circumferential lines, the cylindrical grinding of crystal ingots and the grinding of flat surfaces with cup wheels, such as, for example, the grinding treatment of the side faces of semiconductor wafers or of the ingot end face of a crystal ingot.

According to one embodiment of the invention a liquid cleaning agent is, during the grinding process, directed from at least one nozzle against the working surface of the grinding tool, for example against the cutting edge of an annular saw. In this process, the cleaning agent is exposed to sound waves having a specific frequency and intensity while still in the nozzle.

A further embodiment of the invention includes directing at least two cleaning agent jets against the working surface of the grinding tool, which liquid cleaning agent jets differ from each other in that they are exposed to sound waves of different frequencies. This method is based on the discovery that there is a relationship between the cleaning action of the cleaning agent, the frequency of the sound waves and the size of the particles of the semiconductor material cut during grinding. Under the application of sound waves having relatively high frequencies, relatively small particles are preferentially removed and under the application of sound waves having relatively low frequencies, relatively large particles are preferentially removed. Size and size distribution of the particles depend, in particular, on the particle size of the grinding particle bonded to and bound up into the working surface of the grinding tool.

It is therefore desirable to determine the distribution of the particle sizes of the semiconductor material cut and to expose the cleaning agent to sound waves of those frequencies which make a particularly effective removal of the particles probable. Preferably, 2 to 10, and particularly preferably 2 to 3, different frequencies are used. A further embodiment of the method additionally provides a weighting of the frequencies used by exposing the cleaning agent to sound waves of different frequencies and of different intensities. The action of the cleaning agent is further optimized in this way.

The cleaning agent jets are produced by ejecting the liquid cleaning agent from nozzles. The cleaning agent jets can be acoustically irradiated by an external sound source, for example by a sound generator disposed outside the nozzles. It is again preferred, however, to expose the cleaning agent to sound waves in the nozzles themselves.

To carry out the invention, ultrasonic waves having a frequency of 100 kHz to 10 MHz, and in particular from 0.5 to 3 MHz, are preferred. The intensity of the sound waves is preferably from 10 W to 500 W, with this numerical information relating to the electrical power output for producing the sound waves.

In principle, all the liquid cleaning agents already known that are brought into contact with the working surface of the grinding tool during the grinding treatment of semiconductor material are suitable for use therewith. Water and liquid cooling lubricants or any mixtures thereof are preferred.

The present invention also relates to an apparatus for machining semiconductor material with a grinding tool while feeding a cleaning agent to the working surface of the grinding tool, having means for exposing the cleaning agent to sound waves. The apparatus has at least one nozzle which is directed toward the working surface of the grinding tool, having a component which is built into the nozzle and which generates sound waves of a specific frequency and intensity and having an oscillator which excites the component to vibrate.

BRIEF DESCRIPTION OF THE DRAWINGS

Other objects and features of the present invention will become apparent from the following detailed description considered in connection with the accompanying drawing which discloses the embodiments of the present invention. It should be understood, however, that the drawing is designed for the purpose of illustration only and not as a definition of the limits of the invention.

The apparatus is diagrammatically shown in the drawing FIGURE.

DETAILED DESCRIPTION OF PREFERRED EMBODIMENTS

Turning now in detail to the drawing, there are a plurality of nozzles 2 which are directed against the working surface 1 of the grinding tool, for example the cutting edge of the saw blade of an annular saw. The nozzles are connected via feed lines 3 to a stock container 4 which contains the liquid cleaning agent 5. Every nozzle may also be connected to its own stock container, for example if different liquid cleaning agents are desired. In every nozzle there is a sound generating component or transducer means 6 which is made, for example, of tantalum or piezoceramic material. These components or transducers 6 are excited by the associated alternating voltage sources 7, the so-called oscillators, to vibrate with a specific frequency and intensity. During the treatment of the semiconductor material, the liquid cleaning agent is sprayed under pressure out of the nozzles onto the working surface of the grinding tool, which is generally rotating. During the passage through the nozzles, sound energy is transferred to the liquid cleaning agent. The frequency of the sound waves is dependent on the component 6 built into the nozzle. Its intensity depends on the power output of the associated oscillator. Preferably, 2 to 10 nozzles are provided in which sound waves of different frequencies can be generated.

A further embodiment of the apparatus has the additional feature of a control device 8, which can, for example be a microprocessor control means. Control device 8 controls the operation of each of the available nozzles 2 in accordance with a specified program. Suitable as controllable parameters are the output of cleaning agent, the sound generation in a nozzle and the intensity of the sound generated in the nozzle.

Other objects and features of the present invention will become apparent from the following Examples, which disclose the embodiments of the present invention. It should be understood, however, that the Examples are designed for the purpose of illustration only and not as a definition of the limits of the invention.

EXAMPLE

Silicon semiconductor wafers having a wafer diameter of 200 mm were cut from a single crystal ingot using a conventional annular saw. During the cutting process water was sprayed as liquid cleaning agent out of one nozzle onto the cutting edge of the saw blade of the annular saw. A total of three test series was run, one of them as a comparison test. In the comparison test, the liquid cleaning agent was not exposed to sound waves. During the test series I), the cleaning agent was exposed to ultrasound with a frequency of 1 MHz in the nozzle, and during the test series II), it was exposed to ultrasound with a frequency of 3 MHz after a nozzle change with otherwise unaltered conditions. The results of the test series are listed below in tabular form:

| | Comparison | Test Series I) | Test Series II) |
|---|---|---|---|
| Advance*) | 100 | 150 | 150 |
| Output*) | 100 | 147 | 147 |
| Warp*)**) | 100 | 72.5 | 59.4 |
| TTV*)**)***) | 100 | 89.0 | 72.1 |

*)Numerical information in relative units
**)Numerical value: 3 sigma (99.87%) of all wafers equal or better
***)TTV = total thickness variation While several embodiments of the present invention have been shown and described, it is to be understood that many changes and modifications may be made thereunto without departing from the spirit and scope of the invention as defined in the appended claims.

What is claimed is:

1. A method for machining semiconductor material with a grinding tool while feeding a liquid cleaning agent to a working surface of the grinding tool, comprising directing the liquid cleaning agent in the form of at least two cleaning agent jets against the working surface of the grinding tool;

exposing each of said at least two cleaning agent jets to sound waves of a different frequency; and whereby the liquid cleaning agent is exposed to sound waves having a specific frequency and a specific intensity.

2. The method as claimed in claim 1, comprising exposing said at least two cleaning agent jets to sound waves of different frequency and different intensity.

3. The method as claimed in claim 1, comprising exposing said liquid cleaning agent to sound waves with a frequency of from 0.1 to 10 MHz and an intensity of from 10 to 500 W.

4. The method as claimed in claim 1, comprising controlling action of the liquid cleaning agent by means of the frequency of the sound waves.

5. The method as claimed in claim 1, comprising controlling action of the liquid cleaning agent by means of the frequency of the sound waves and by means of the intensity of the sound waves.

6. An apparatus for machining semiconductor material with a grinding tool while feeding a cleaning agent to a working surface of the grinding tool, comprising at least two nozzles which are directed toward the working surface of the grinding tool;

at least two sound generating component means with one sound generating component means built into each nozzle which generates sound waves of a specific frequency and intensity;

at least two oscillators with one oscillator for each sound generating component means, and each oscillator excites the sound generating component to vibrate and to generate sound waves; and means for feeding said cleaning agent to and through said at least two nozzles for exposing the cleaning agent to sound waves of a different frequency.

7. The apparatus as claimed in claim 6, comprising 2 to 10 nozzles for generating sound waves of different frequencies.

8. The apparatus as claimed in claim 6, further comprising a control device for controlling the frequency of the sound waves generated in the nozzle, for controlling the intensity of the sound waves generated in the nozzle and for controlling the output of cleaning agent from the nozzle.

\* \* \* \* \*